United States Patent
Hatch et al.

(10) Patent No.: US 11,197,401 B2
(45) Date of Patent: Dec. 7, 2021

(54) SYSTEM AND METHOD FOR LARGE-SCALE PCB PRODUCTION INCLUDING CONTINUOUS SELECTIVE ADHESION

(71) Applicant: HONEYWELL FEDERAL MANUFACTURING & TECHNOLOGIES, LLC, Kansas City, MO (US)

(72) Inventors: Jonathan Douglas Hatch, Cleveland, MO (US); Stephen McGarry Hatch, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 243 days.

(21) Appl. No.: 16/253,296

(22) Filed: Jan. 22, 2019

(65) Prior Publication Data

US 2020/0236827 A1 Jul. 23, 2020

(51) Int. Cl.
*H05K 13/06* (2006.01)
*H05K 13/04* (2006.01)

(52) U.S. Cl.
CPC ......... *H05K 13/06* (2013.01); *H05K 13/0417* (2013.01)

(58) Field of Classification Search
CPC .. H05K 13/0417; H05K 13/06; H05K 1/0393; H05K 2201/0999; H05K 2203/1545; H05K 3/046; H05K 3/303
See application file for complete search history.

(56) References Cited

U.S. PATENT DOCUMENTS

| | | | |
|---|---|---|---|
| 4,659,426 A * | 4/1987 | Fuller | H01L 21/32137 204/192.32 |
| 5,110,400 A | 5/1992 | Nagafuchi et al. | |
| 5,879,489 A | 3/1999 | Burns et al. | |
| 5,976,391 A * | 11/1999 | Belke, Jr. | H05K 3/022 216/13 |
| 6,360,803 B1 * | 3/2002 | d'Hondt | B29C 65/26 156/499 |
| 7,293,355 B2 | 11/2007 | Lauffer et al. | |
| 7,304,780 B2 | 12/2007 | Liu et al. | |
| 7,328,502 B2 | 2/2008 | Lauffer et al. | |
| 7,863,760 B2 | 1/2011 | Daniels et al. | |

(Continued)

*Primary Examiner* — Minh N Trinh
(74) *Attorney, Agent, or Firm* — Hovey Williams LLP (57) ABSTRACT

A method for the large-scale production of PCBs including a continuous selective adhesion process for creating printed circuit traces providing input to a production line. A roll of printed circuit traces is produced using rolls of flexible substrate, conductive layer, and conductive layer support by applying adhesive between the rolls of flexible substrate and conductive layer, bringing the rolls together, transferring a circuit pattern onto the flexible substrate, curing the adhesive through non-opaque areas of the circuit pattern, and separating the non-bonded areas. The resulting printed circuit traces are applied from the roll to mounts, and circuit components are applied from a roll to the traces as the mounts move along the line. Additional rolls of printed circuit traces and circuit components may be incorporated, and multi-layer PCBs may be produced. As part of the production line, the finished PCBs may be applied to flat or contoured products.

12 Claims, 8 Drawing Sheets

(56) References Cited

U.S. PATENT DOCUMENTS

| | | |
|---|---|---|
| 7,977,034 B1 | 7/2011 | Lauffer et al. |
| 8,220,704 B2 | 7/2012 | Atkin et al. |
| 9,504,148 B1 | 11/2016 | Hatch et al. |
| 9,795,035 B2 | 10/2017 | Hatch et al. |
| 2020/0236827 A1* | 7/2020 | Hatch .................... H05K 3/046 |

* cited by examiner

SYSTEM AND METHOD FOR LARGE-SCALE PCB PRODUCTION INCLUDING CONTINUOUS SELECTIVE ADHESION

STATEMENT REGARDING FEDERALLY-SPONSORED RESEARCH OR DEVELOPMENT

This invention was made with government support under Contract No.: DE-NA0000622 awarded by the Department of Energy. The government has certain rights in the invention.

FIELD

The present invention relates to systems and methods for producing printed circuit boards, and more particularly, embodiments concern a system and method for the large-scale production of printed circuit boards including a continuous selective adhesion process for creating printed circuit traces providing input to a production line.

BACKGROUND

It is often desirable to produce large quantities of printed circuit boards (PCBs) for incorporation into or onto other products. The large-scale production of PCBs utilizes costly and time-consuming chemical processes involving etchants, washes, and chemical deposition to selectively form layers of conductive material that produce the desired circuit traces. These chemical technologies often require special processing or outsourcing to other manufacturers, which can complicate and slow PCB production. Other methods of manufacturing PCBs include milling operations and conductive ink printing, both of which require specialized equipment and use costly materials. Also, most conductive ink technologies lack the durability to solder electrical components to physical circuits.

U.S. Pat. Nos. 9,504,148 and 9,795,035 describe a system using a selective adhesion process for rapidly creating prototypes of PCBs which can then be used for testing and durable applications. However, this system is practical for producing only one or at most a few instances of a particular PCB design and, without more, would be extremely inefficient for producing large quantities of the PCB design.

This background discussion is intended to provide information related to the present invention which is not necessarily prior art.

SUMMARY

Embodiments address the above-described and other problems by providing a system and method for the large-scale production of PCBs including one or more continuous selective adhesion processes for creating printed circuit traces providing inputs to a production line.

In a first embodiment of the present invention, a system is provided for producing a large quantity of PCBs. The system may include a first mechanical conveyor, a first roll of a plurality of printed circuit traces, and a first roll of a first plurality of circuit components. The first mechanical conveyor may be configured to convey a plurality of mounts along a production line. The first roll of the first plurality of printed circuit traces may be configured to physically apply one or more first printed circuit traces to each mount as the mount is conveyed along the production line, wherein each first printed circuit trace is produced using a selective adhesion process. The first roll of the first plurality of circuit components may be configured to physically apply one or more first circuit components to at least one of the one or more first printed circuit traces on each mount as the mount is conveyed along the production line to produce the large quantity of PCBs.

Various implementations of the first embodiment may include any one or more of the following additional features. The system may further include rolls of a flexible substrate, a conductive layer, and a conductive layer support, a transfer mechanism, a curing mechanism, and a separation mechanism. A curable adhesive may be applied between the rolls of flexible substrate and conductive layer, and then the rolls may be brought together. The transfer mechanism may be configured to repeatedly transfer a circuit pattern onto the roll of the flexible substrate, wherein the circuit pattern includes opaque areas and non-opaque areas. The curing mechanism may be configured to cure the curable adhesive through the non-opaque areas of each circuit pattern, resulting in bonded areas and non-bonded areas. The curing mechanism may employ technology selected from the group consisting of: lasers, projected energy, directed energy, and combinations thereof. The separation mechanism may be configured to separate the non-bonded areas, thereby resulting in the first roll of the first plurality of printed circuit traces.

The system may further include additional rolls of an additional plurality of printed circuit traces and an additional plurality of circuit components configured to physically apply additional printed circuit traces to each mount and additional circuit components to each printed circuit trace as the mount is conveyed along the production line. At least one of the additional printed circuit traces may include one or more vias and may be layered over at least one of the first printed circuit traces to produce a multi-layered circuit. The first printed circuit traces and the additional printed circuit traces may be applied to the mount before the first circuit components are applied to the first printed circuit traces and before the additional circuit components are applied to the additional printed circuit traces. The system may further include an additional mechanical conveyor configured to convey a plurality of items along the production line, wherein each item has a contoured surface, and one or more of the PCBs are applied to the contoured surface on each item. The item may be a main product of a different system, and the main product may be aircraft or other vehicle bodies or other components, human or animal skins or hides, wall coverings or windows, product labels, or the like.

In a second embodiment of the present invention, a method is provided for producing a large quantity of PCBs. The method may include the following actions. A first mechanical conveyor may convey a plurality of mounts along a production line. One or more first printed circuit traces from a first roll of a first plurality of printed circuit traces may be applied to each mount as the mount is conveyed along the production line, wherein each first printed circuit trace is produced using a selective adhesion process. One or more first circuit components from a first roll of a first plurality of circuit components may be applied to at least one of the one or more first printed circuit traces on each mount as the mount is conveyed along the production line to produce the large quantity of PCBs.

Various implementations of the second embodiment may include any one or more of the following additional features. The method may further include producing the first roll of the first plurality of printed circuit traces by providing rolls of a flexible substrate, a conductive layer, and a conductive layer support, applying a curable adhesive between the rolls of flexible substrate and conductive layer, and bringing together the rolls. A circuit pattern may be repeatedly transferred onto the roll of the flexible substrate, wherein the circuit pattern includes opaque areas and non-opaque areas. The curable adhesive may be cured through the non-opaque areas of each circuit pattern, resulting in bonded areas and non-bonded areas. The curing mechanism may employ technology selected from the group consisting of: lasers, projected energy, directed energy, and combinations thereof. The non-bonded areas may be separated. The method may further include physically applying additional printed circuit traces and circuit components from additional rolls to each mount as the mount is conveyed along the production line. The additional printed circuit traces may include vias and may be layered over the first printed circuit traces to produce a multi-layered circuit. The first printed circuit traces and the additional printed circuit traces may be applied to the mount before the first circuit components are applied to the first printed circuit traces and before the additional circuit components are applied to the additional printed circuit traces.

The method may further include conveying with an additional mechanical conveyor a plurality of items along the production line, wherein each item has a contoured surface, and applying one or more of the PCBs to the contoured surface on each item. The item may be a main product of a different method, and the main product may be aircraft or other vehicle bodies or other components, human or animal skins or hides, wall coverings or windows, product labels, or the like.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment", "an embodiment", or "embodiments" mean that the feature or features referred to are included in at least one embodiment of the invention. Separate references to "one embodiment", "an embodiment", or "embodiments" in this description do not necessarily refer to the same embodiment and are not mutually exclusive unless so stated. Specifically, a feature, structure, act, etc. described in one embodiment may also be included in other embodiments, but is not necessarily included. Thus, particular implementations of the present invention can include a variety of combinations and/or integrations of the embodiments described herein.

Broadly characterized, embodiments of the present invention provide a system and method for the large-scale production of PCBs including one or more continuous selective adhesion processes for creating printed circuit traces providing inputs to a production line. On the production line, printed circuit traces from one or more rolls of printed circuit traces are physically applied to mounts, and circuit components from one or more rolls of circuit components are physically applied to the mounted printed circuit traces to create a large quantity of the PCBs. As used herein, "a large quantity" shall mean at least five hundred copies, or at least one thousand copies. The printed circuit traces may be produced using the selective adhesion process.

Production of the rolls of printed circuit traces using the selective adhesion process may use as inputs rolls and/or other continuous application technologies of PCB film, adhesive, and other materials. The rolls may be produced as part of the production line or the rolls may be produced elsewhere and introduced as inputs to the production line. If the rolls of printed circuit traces are produced as part of the larger production line, the selective adhesion process may be adapted for implementation using large conveyors, rolling applicators, and/or other continuous application technologies to efficiently and rapidly produce the rolls, including performing any peeling and curing processes. Thus, the large-scale production of PCBs can be simplified into a single continuous running line performing as many of the initial, intermediate, and final subprocesses as desired or needed.

Further, embodiments allow for flexibility in various aspects of the production process. Multiple materials may be used for substrate, adhesive, and/or conductive layers, and/or any additional layers, as desired or as needed for particular applications. Multilayer circuit boards may be produced using rigid, flexible, or a combination of rigid and flexible materials. Multiple curing methods may be used in the same line, as desired or as needed for particular applications. Post-processing operations may be introduced before or after the curing or peeling stages of the selective adhesion process. In-line processes for secondary products may be introduced in which the PCBs are adhered or otherwise applied to a flat or contoured surface or product surface. For example, the PCBs may be adhered secondarily to a main product line of aircraft or other vehicle bodies or other components, other PCB surfaces, human or animal skins, wall coverings or windows, product labels, etc. In one implementation, the PCB production line may be sufficiently miniaturized so as to provide a personal PCB printer configured for the large-scale production of PCBs on a desktop.

Thus, embodiments advantageously allow for continuously creating printed circuit traces, placing parts, and adhering them together to produce thousands of complex PCBs relatively inexpensively and quickly compared to production by prior art chemical etching and deposition processes. The production line may include component placement, lamination, hole punching, spray adhesive, soldering, labeling, peeling, curing, and/or substantially any other desired or needed in-line process as part of one seamless operation.

Figure 1:
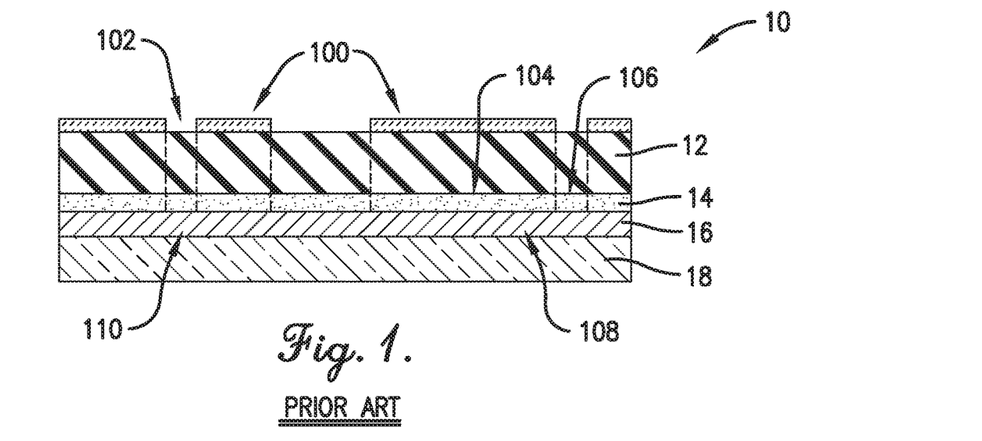
FIG. 1 (PRIOR ART) is a cross-sectional elevation view of a printed circuit blank including various initial layers.
Figure 2:
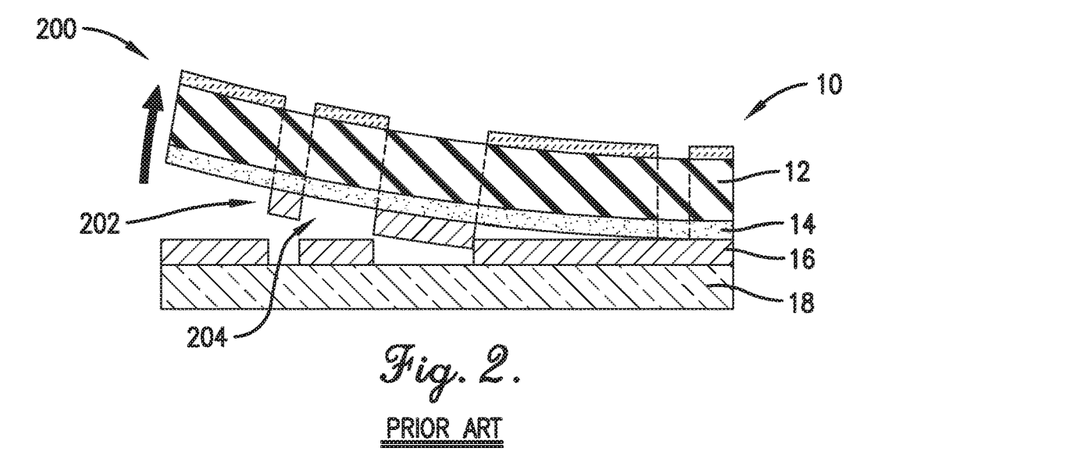
FIG. 2 (PRIOR ART) is a cross-sectional elevation view of the printed circuit blank in which the layers are being separated after some processing.
Figure 3:
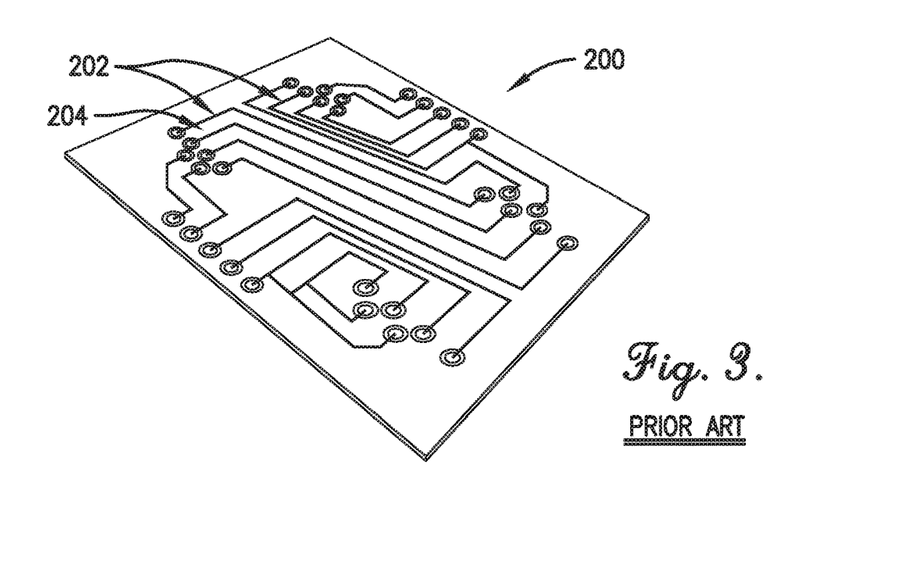
FIG. 3 (PRIOR ART) is an isometric view of a printed circuit trace resulting from separation of the layers in FIG. 2.

Referring to FIGS. 1, 2, and 3, a printed circuit blank 10 may include a flexible substrate 12, a curable adhesive 14, a conductive layer 16, and a conductive layer support 18. The flexible substrate 12 may be transparent or translucent to allow light or another stimulant to pass therethrough, and may be an electrical insulator. The flexible substrate 12 may be formed from substantially any suitable flexible material, such as of plastic, polyester, Mylar, Kapton, polyimide, or polyether ether ketone. The flexible substrate 12 may be easily sheared, torn, or cut so that it can be introduced in the form of large rolls of stock material and subsequently divided. The curable adhesive 14 may be positioned between the flexible substrate 12 and the conductive layer 16 and may cure locally when exposed to substantially any suitable stimulant, such as near-UV light, UV light, blue wavelength light, light in any other range on the light wavelength spectrum such as infrared light or ultraviolet light, or heat. More specifically, portions of the curable adhesive 14 which are exposed to the light or other stimulant may cure while adjacent portions of the curable adhesive 14 not exposed to the light or other stimulant may remain uncured. Thus, selective bonding of the flexible substrate 12 to the conductive layer 16 may be achieved. The curable adhesive 14 may be substantially any suitable adhesive, such as Locktite®, and may be applied to the flexible substrate 12 using substantially any suitable process, such as spraying, dipping, or rolling. The curing mechanism may employ substantially any suitable technology, such as laser, projected energy, or directed energy technologies, or combinations thereof.

The conductive layer 16 may be positioned between the curable adhesive 14 and the conductive layer support 18 and may be configured to bond to portions of the curable adhesive 14. The conductive layer 16 may be formed of substantially any suitable material such as a thin conductive foil or metal, and may be applied using substantially any suitable process, such as foiling or spraying. The conductive layer 16 may be configured to shear or tear when the flexible substrate 12 and the conductive layer support 18 are separated.

The conductive layer support 18 protects and supports the conductive layer 16 before use and may be positioned adjacent to the conductive layer 16 opposite the curable adhesive 14. The conductive layer support 18 may be lightly adhered to the conductive layer 16 by a low-tack adhesive such that the adherence between the conductive layer support 18 and the conductive layer 14 is less than the adherence from the bond between the conductive layer 16 and the cured portions of the curable adhesive 14. The conductive layer support 18 may be substantially any suitable flexible or rigid material. Thus, the printed circuit blank 10 may be a multi-layered laminate material and may be configured to be sheared, torn, or cut from large rolls.

In use, a negative (or positive) circuit pattern may be created (e.g., using CAD software) and printed or otherwise transferred in opaque ink onto the flexible substrate 12 of the printed circuit blank 10. The opaque negative circuit pattern 100 may be partially or completely opaque to the light or other stimulant so as to shield portions of the flexible substrate 12 and corresponding portions 104 of the curable adhesive 14. Gaps 102 in the opaque negative circuit pattern 100 leave other portions of the flexible substrate 12 and corresponding portions 106 of the curable adhesive 14 exposed (delineated from shielded portions 104 by dashed lines in FIG. 1).

The printed circuit blank 10 may then be exposed to the light or other stimulant such that the stimulant penetrates the portions of the flexible substrate 12 and the portions 106 of the curable adhesive 14 exposed by the gaps 102 in the opaque negative circuit pattern 100. The portions 106 of the curable adhesive 14 exposed to the light or other stimulant may then cure so as to bond to corresponding portions 108 of the conductive layer 16.

As shown in FIG. 2, the flexible substrate 12 and the conductive layer support 18 may then be peeled or otherwise separated from each other after the curable adhesive 14 has cured such that the bonded portions 108 of the conductive layer 16 are retained by the flexible substrate 12 and the non-bonded portions 110 of the conductive layer 16 are retained by the conductive layer support 18.

As shown in FIG. 3, the flexible substrate 12, curable adhesive 14, and bonded portions 108 of the conductive layer 16 to form a printed circuit trace 200 with the bonded portions 108 of the conductive layer 16 forming circuit traces 202 corresponding to the circuit pattern. Spaces 204 between the circuit traces 202 insulate the circuit traces 202 from each other. Wires and other electronic circuit components may then be soldered or connected to the circuit traces 202 to create a completed circuit. The conductive layer support 18 and the non-bonded portions 110 of the conductive layer 16 (that is, the sacrificial portions of the conductive layer 16 remaining with the conductive layer support 18) may be disposed or recycled.

The printed circuit trace 200 may be used with additional traces and/or other circuit components to create multiple layered circuits. The printed circuit trace 200 may be rolled, bent, or flexed, or firm and rigid. The printed circuit trace 200 may also be bonded to a surface having a three-dimensional contour via the uncured regions of the curable adhesive 14 or via another adhesive. It will be understood that the layers of the printed circuit blank 10 may be arranged in different orders or utilized in opposite fashion for creating the printed circuit trace 200. For example, the conductive layer support 18 may form the base of the printed blank 10 while the flexible substrate 12 is removed. In this case, an opaque positive circuit pattern instead of an opaque negative circuit pattern would be printed or otherwise transferred onto the printed circuit blank 10.

Figure 4:
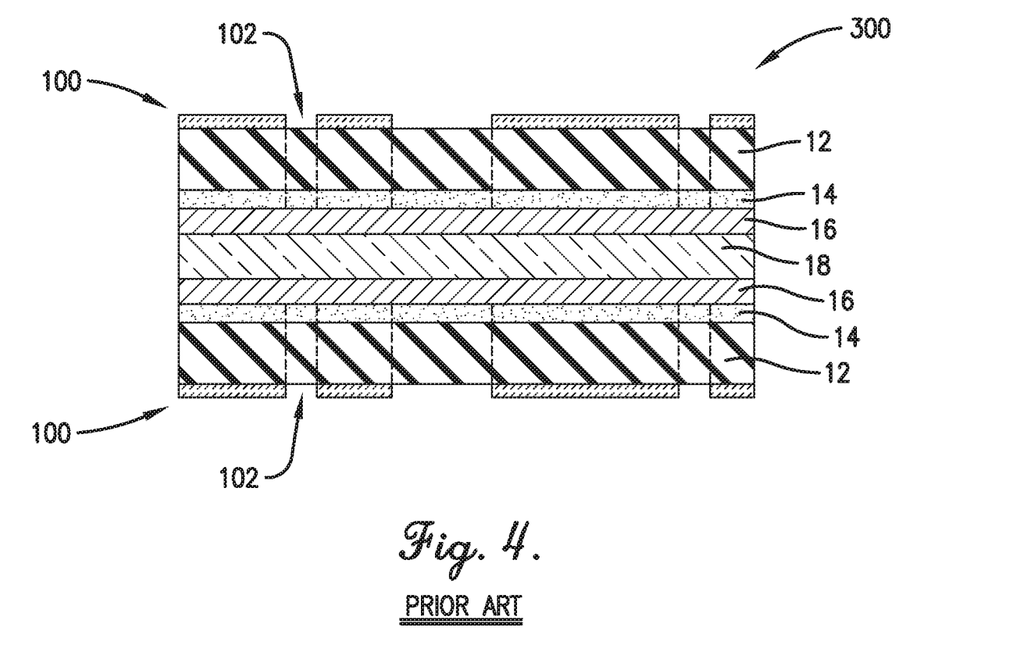
FIG. 4 is a cross-sectional elevation view of a double-sided version of the printed circuit blank of FIG. 1.

Referring also to FIG. 4, an implementation of the present technology may involve a double-sided printed circuit blank 300, similar to the above-described printed circuit blank 10, except that the double-sided printed circuit blank 300 may have an inverted set of layers on the second side of the conductive layer support 18. Opaque circuit patterns may be printed on the surfaces of both flexible substrates such that the resulting double-sided printed circuit has circuit traces on both sides. The conductive layer support 18 may include pre-formed vias (electrical paths) or interconnects extending between the conductive layers 16 for connecting the opposing circuit traces.

Figure 5:
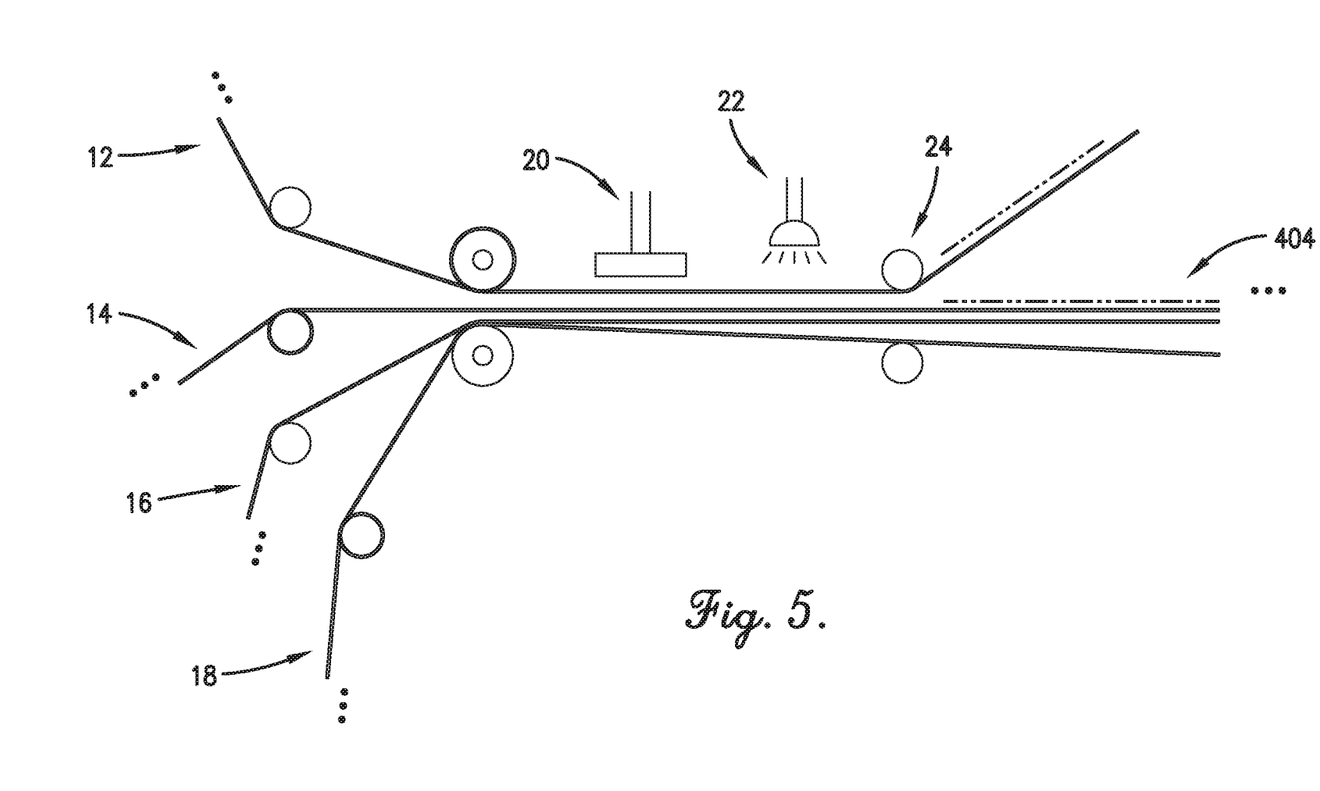
FIG. 5 is a fragmentary elevation view of a first implementation of a system or a first part of a system for the large-scale production of PCBs, wherein the system produces one or more rolls of printed circuit traces using the process shown in FIGS. 1-5.

A plurality of the above-described printed circuit traces may be provided in the form of one or more long rolls, and the above-described process for producing a single printed circuit trace may be repeated to produce the one or more long rolls. Referring to FIG. 5, an example system or subsystem for the large-scale production of one or more rolls of printed circuit traces 200 is shown. Rolls or other technologies for the continuous application of the flexible substrate 12, the curable adhesive 14, the conductive layer 16, and the conductive layer support 18 may be provided. A printer 20 or other technology for transferring circuit patterns to the flexible substrate 12 may be provided. Although shown as occurring after the flexible substrate 12 has been brought together with the other components 14, 16, 18, the printing process may occur earlier, as desired or needed. A lamp 22 or other technology for curing the adhesive 14 may be provided, and a peeler 24 or other technology for separating the bonded areas from the unbonded areas may be provided, resulting in a continuous length of material supporting a plurality of printed circuit traces 200.

Figure 6:
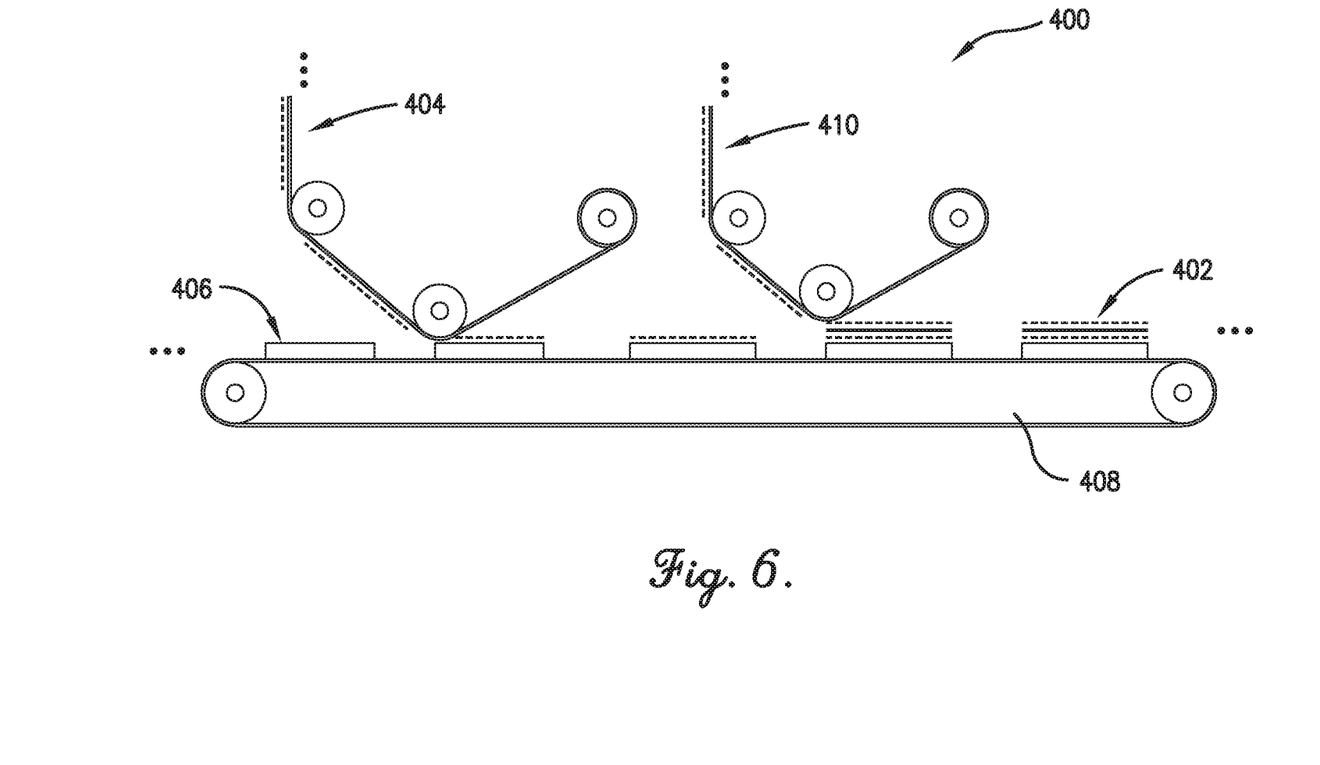
FIG. 6 is a fragmentary elevation view of a second implementation of the system or a second part of the system for the large-scale production of PCBs, wherein the system produces or otherwise receives as an input one or more rolls of printed circuit traces produced using the process shown in FIGS. 1-5.

Referring also to FIG. 6, an embodiment of a production line 400 is shown configured for the large-scale production of PCBs 402. The above-described system or subsystem for the large-scale production of one or more rolls of printed circuit traces 404 may be an integral part of this larger production line 400, or the one or more rolls of printed circuit traces 404 may be produced elsewhere and used as inputs to the production line 400.

Figure 7:
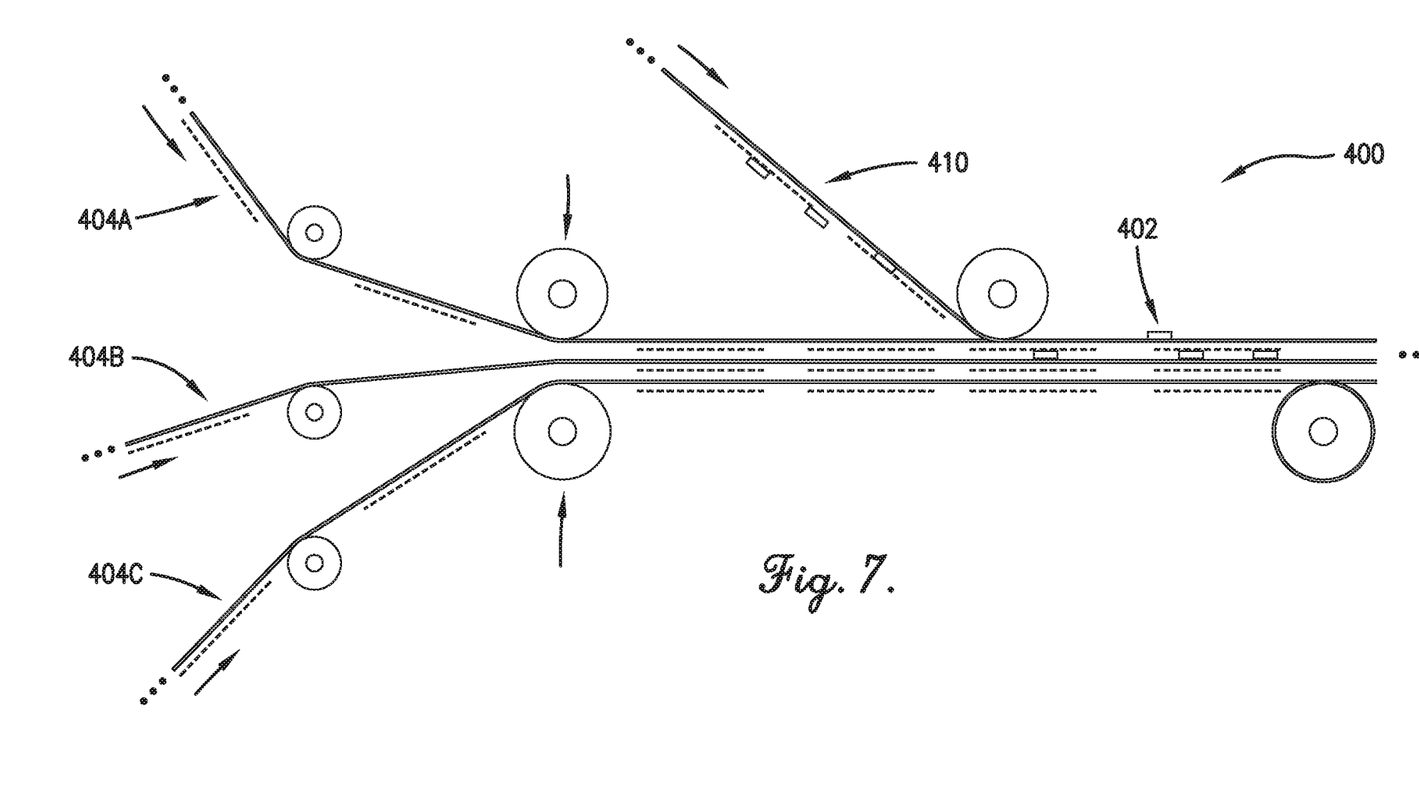
FIG. 7 is a fragmentary elevation view of a third implementation of the system or a third part of the system for the large-scale production of PCBs, wherein the system produces or otherwise receives as an input one or more rolls of printed circuit traces produced using the process shown in FIGS. 1-5.

A plurality of PCB mounts 406 may be provided spaced apart from one another on a conveyor belt 408. The PCB mounts 406 may themselves be simple or complex, static or dynamic, and/or flat or contoured products. One or more rolls of other circuit components 410 may be provided, such as rolls of electrical and/or electronic components, additional rolls of printed circuit traces for PCBs having multiple layers of circuit traces, and/or rolls of insulating, separating, or covering materials. For the production of PCBs having multiple layers, each roll of printed circuit traces may be followed by rolls of other circuit components so that each layer is built in turn. Alternatively, referring also to FIG. 7, for the production of PCBs having multiple layers, multiple rolls of printed circuit traces 404A,404B,404C may be combined before additional components and/or materials are added. In implementations involving multiple layers, the individual layers may be labelled, tagged, scanned, or otherwise logistically processed as intermediate steps during the production process.

Figure 8:
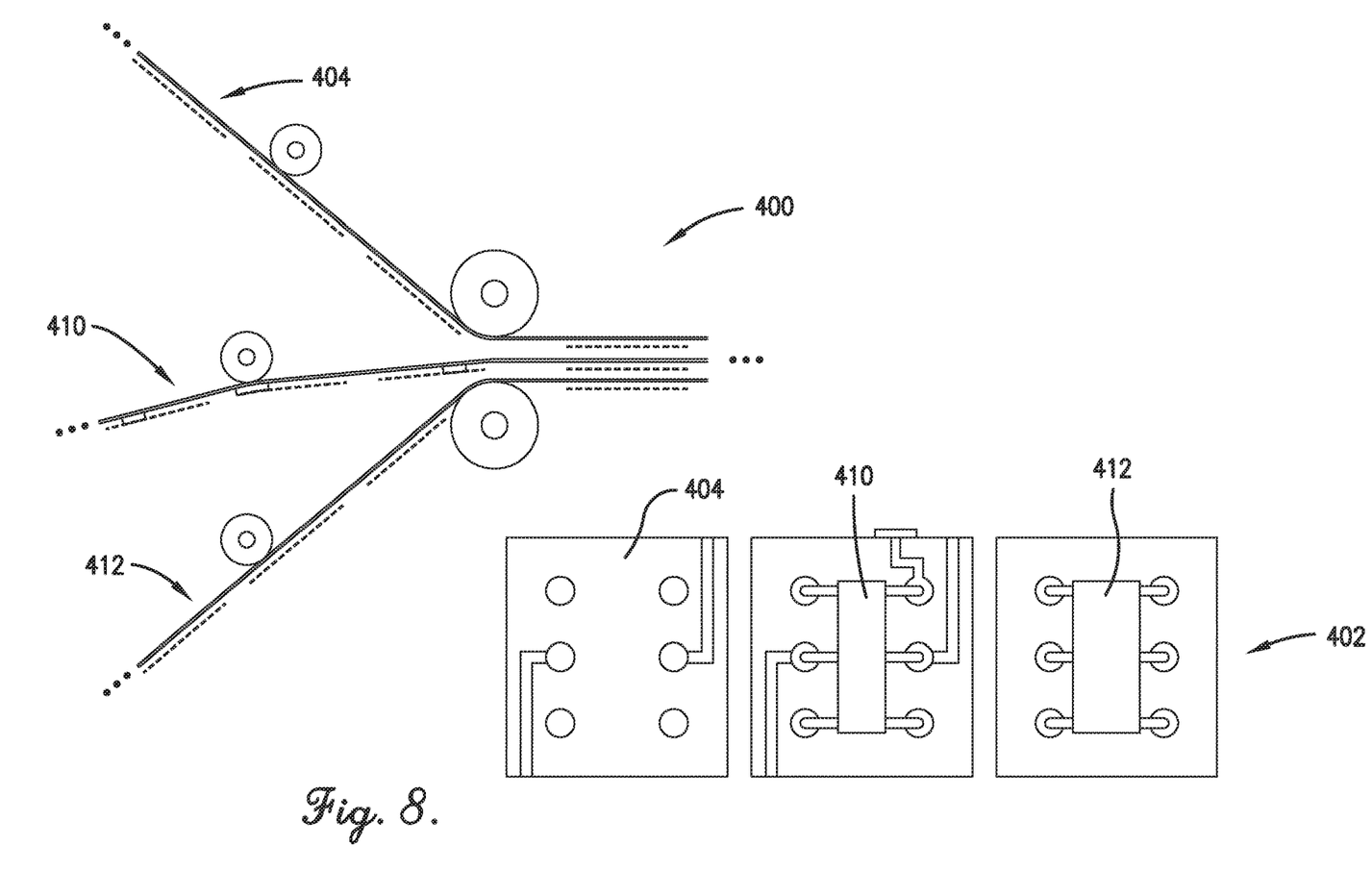
FIG. 8 is a plan view of example PCBs shown in different stages of production.
Figure 9:
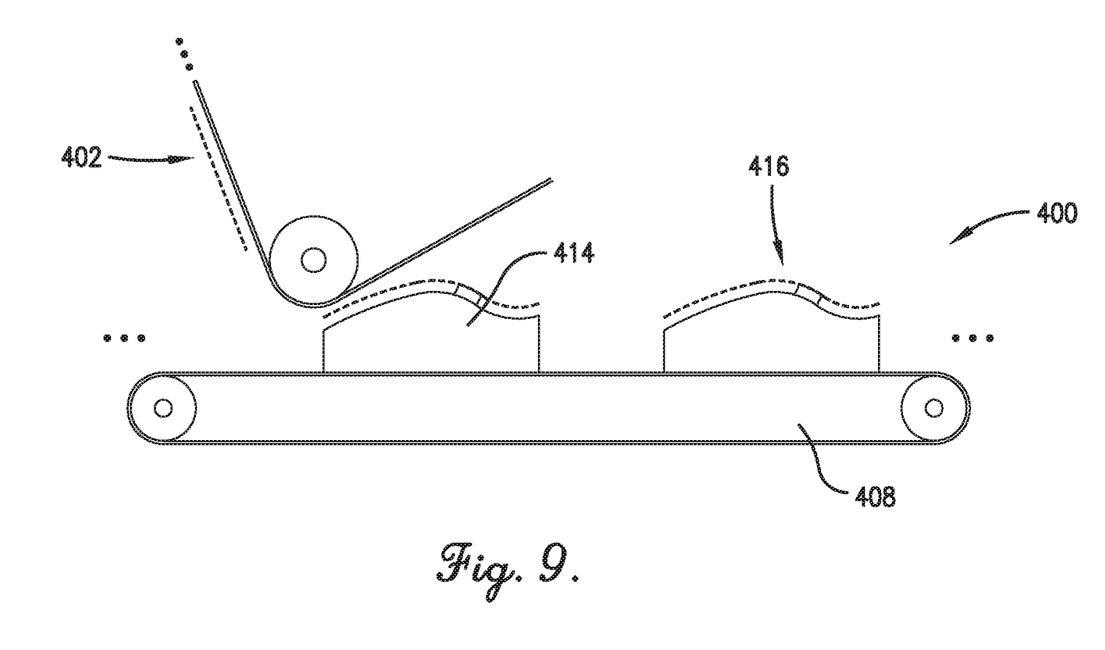
FIG. 9 is a fragmentary elevation view of an implementation of the systems of FIGS. 5, 6, and/or 7 in which the PCBs are being applied to a contoured surface.

Referring also to FIG. 8, an example implementation is shown in which the roll of printed circuit traces 404 is brought together with a roll of circuit components 410 and a roll of film material 412 on the production line 400 to create the PCBs 402. Referring also to FIG. 9, an example implementation is shown in which the PCBs 402 are then applied to a plurality of items 414 (e.g., the product of a separate production process) to produce an integrated product 416. Each of the items 414 may have flat and/or contoured surfaces to which one or more PCBs are applied. For example, this may involve application of the PCBs 402 to aircraft or other vehicle bodies or other components, human or animal skins, wall coverings or windows, product labels, or the like. Such a production line may be used to produce, e.g., personal electronic devices, inexpensive sensors, radio-frequency antennas, active product labels, medical devices, medical or concert bracelets, automotive sensors, and the like.

Thus, the production line may include circuit design, layout design, curing, separation, and component placement stages of the selective adhesion method in one smooth operation. Films, adhesives, conductive layers, selective curing operations, peeling operations, and the like may be used to fabricate PCBs on a larger scale than possible with prior art etching or machining operations. Furthermore, multiple layers may be brought and adhered together creating a multilayer circuit board with vias, through holes, or components placed in one continuous line. In addition, the production line may allow multiple curing methods in the same line and may allow for multiple material options for substrate, adhesive, conductive layers, or any additional layers. The production line may also use a combination of rigid or flexible materials for producing the multilayer circuit boards. The system 10 may include more, fewer, or alternative components and/or perform more, fewer, or alternative actions, including those discussed elsewhere herein, and particularly those discussed in the following section describing the computer-implemented method.

Figure 10:
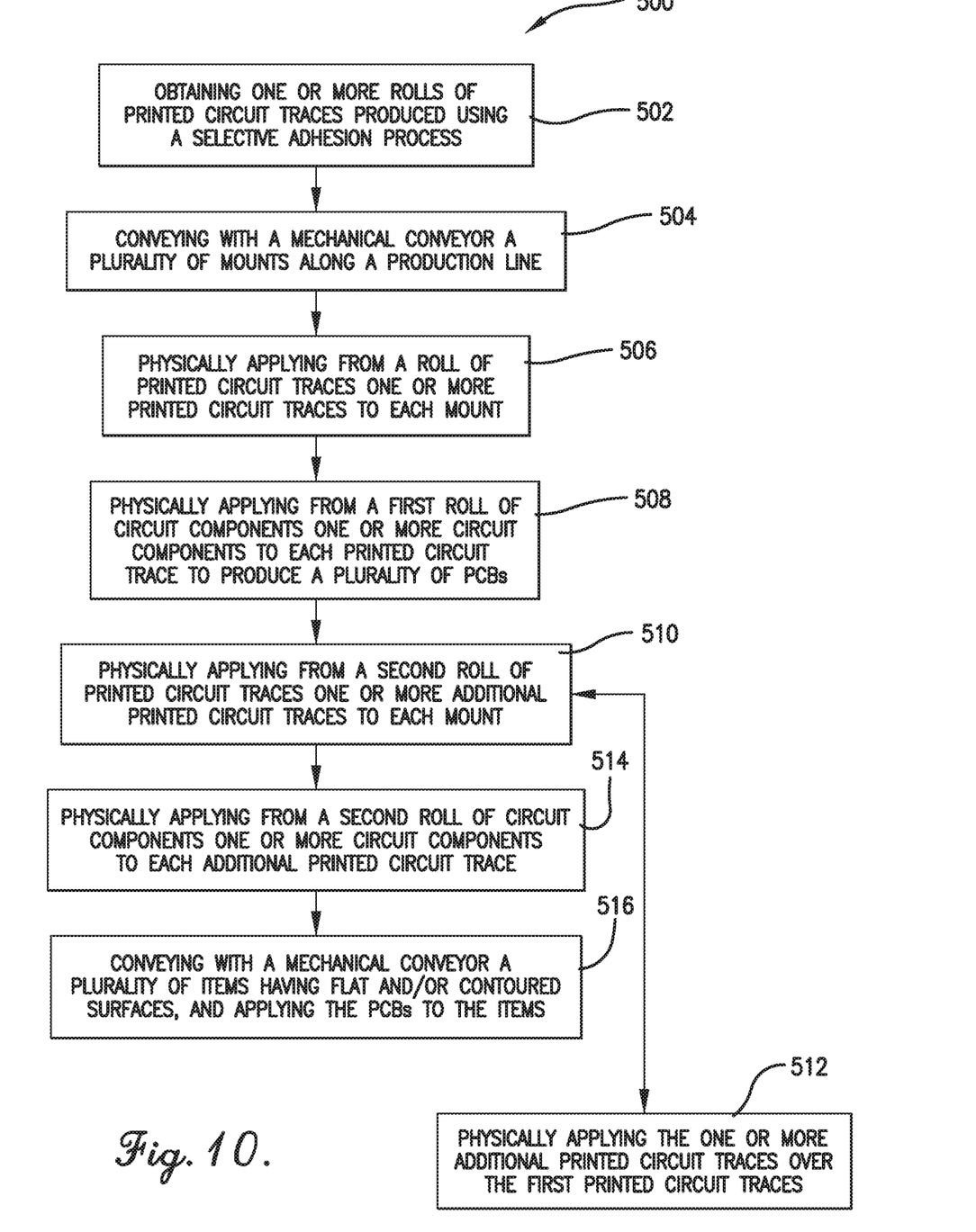
FIG. 10 is a flowchart of an embodiment of a method for the large-scale production of PCBs, wherein the method uses as an input one or more rolls of printed circuit traces which may be produced using the process shown in FIGS. 1-5.

Referring also to FIG. 10, an embodiment of a method 500 is shown for accomplishing the large-scale production of a large quantity of PCBs 402. The method 500 may be a corollary to the functionality of the system of FIGS. 1-8, and may be similarly implemented using the various components of the system. Broadly, the method 500 may proceed substantially as follows. Initially, one or more rolls of printed circuit traces 404 may be produced or otherwise obtained having been produced using a selective adhesion process, as shown in 502. A plurality of mounts 406 may be conveyed with a first mechanical conveyor 408 along a production line 400, as shown in 504. One or more first printed circuit traces from a first roll of a first plurality of printed circuit traces 404 may be physically applied to each mount 406 as the mount is conveyed along the production line 400, as shown in 506. One or more first circuit components from a first roll of a first plurality of circuit components 410 may be physically applied to at least one of the one or more first printed circuit traces on each mount 406 as the mount is conveyed along the production line 400 to produce the large quantity of the PCBs 402, as shown in 508.

In one implementation, one or more additional pluralities of printed circuit traces from one or more additional rolls of pluralities of printed circuit traces 404B, 404C may be physically applied to each mount 406 as the mount is conveyed along the production line 400, as shown in 510. In a version of this implementation, at least one of the additional printed circuit traces includes one or more vias and is layered over at least one of the first printed circuit traces to produce a multi-layered circuit, as shown in 512.

One or more additional circuit components from one more additional rolls of one or more additional pluralities of circuit components 412 may be physically applied to at least one of the one or more additional printed circuit traces on each mount 406 as the mount is conveyed along the production line 400, as shown in 514. In a version of this implementation, the one or more first printed circuit traces and the one or more additional printed circuit traces may be applied to the mount before the one or more first circuit components are applied to the one or more first printed circuit traces and before the one or more additional circuit components are applied to the one or more additional printed circuit traces.

In one implementation, a plurality of items 414 may be conveyed with an additional mechanical conveyor 408 along the production line 400, wherein each item 414 has a flat and/or contoured surface, and one or more of the PCBs 402 may be applied to the surface on each item 414 to produce an integrated product 416, as shown in 516. The method 210 may include more, fewer, or alternative actions, including those discussed elsewhere herein.

It will be appreciated that any one or more of the subprocesses shown in the figures, including multiple instances thereof, may be combined in the larger production line 400, as indicated by the ellipses shown in FIGS. 5-9.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A method of producing a large quantity of printed circuit boards, the method comprising:
    conveying with a first mechanical conveyor a plurality of non-conductive mounts along a production line;
    physically applying from a first roll of a first plurality of printed circuit traces one or more first printed circuit traces to each non-conductive mount as the non-conductive mount is conveyed along the production line, wherein each first printed circuit trace is produced using a selective adhesion process; and
    physically applying from a first roll of a first plurality of circuit components one or more first circuit components to at least one of the one or more first printed circuit traces on each non-conductive mount as the non-conductive mount is conveyed along the production line to produce the large quantity of printed circuit boards.

2. The method of claim 1, further including producing the first roll of the first plurality of printed circuit traces, including—
    providing a roll of a flexible substrate;
    providing a roll of a conductive layer;
    providing a roll of a conductive layer support;
    applying a curable adhesive between the roll of the flexible substrate and the roll of the conductive layer, and bringing together the rolls of the flexible substrate, the conductive layer, and the conductive layer support;
    repeatedly transferring a circuit pattern onto the roll of the flexible substrate, the circuit pattern including opaque areas and non-opaque areas;
    curing the curable adhesive through the non-opaque areas of each circuit pattern, resulting in bonded areas and non-bonded areas; and
    separating the non-bonded areas.

3. The method of claim 1, further including—
    physically applying from one or more additional rolls of one or more additional pluralities of printed circuit traces one or more additional printed circuit traces to each non-conductive mount as the non-conductive mount is conveyed along the production line; and
    physically applying from one more additional rolls of one or more additional pluralities of circuit components one or more additional circuit components to at least one of the one or more additional printed circuit traces on each non-conductive mount as the non-conductive mount is conveyed along the production line.

4. The method of claim 3, wherein at least one of the additional printed circuit traces includes one or more vias and is layered over at least one of the first printed circuit traces to produce a multi-layered circuit.

5. The method of claim 3, wherein the one or more first printed circuit traces and the one or more additional printed circuit traces are applied to the non-conductive mount before the one or more first circuit components are applied to the one or more first printed circuit traces and before the one or more additional circuit components are applied to the one or more additional printed circuit traces.

6. A method of producing a large quantity of printed circuit boards, the method comprising:
    conveying with a first mechanical conveyor a plurality of mounts along a production line;
    physically applying from a first roll of a first plurality of printed circuit traces one or more first printed circuit traces to each mount as the mount is conveyed along the production line, wherein each first printed circuit trace is produced using a selective adhesion process;
    physically applying from a first roll of a first plurality of circuit components one or more first circuit components to at least one of the one or more first printed circuit traces on each mount as the mount is conveyed along the production line to produce the large quantity of printed circuit boards;
    conveying with an additional mechanical conveyor a plurality of items along the production line, wherein each item has a contoured surface; and
    applying one or more of the printed circuit boards to the contoured surface on each item.

7. The method of claim 6, wherein the item is a main product of a different method.

8. The method of claim 7, wherein the main product is a vehicle component.

9. A method of producing a large quantity of printed circuit boards, the method comprising:
    producing the first roll of the first plurality of printed circuit traces, including—
        providing a roll of a flexible substrate,
        providing a roll of a conductive layer,
        providing a roll of a conductive layer support,
        applying a curable adhesive between the roll of the flexible substrate and the roll of the conductive layer, and bringing together the rolls of the flexible substrate, the conductive layer, and the conductive layer support,
        repeatedly transferring a circuit pattern onto the roll of the flexible substrate, the circuit pattern including opaque areas and non-opaque areas,
        curing the curable adhesive through the non-opaque areas of each circuit pattern, resulting in bonded areas and non-bonded areas, and
        separating the non-bonded areas;
    conveying with a first mechanical conveyor a plurality of mounts along a production line;
    physically applying from the first roll of the first plurality of printed circuit traces one or more first printed circuit traces to each mount as the mount is conveyed along the production line, wherein each first printed circuit trace is produced using a selective adhesion process; and physically applying from a first roll of a first plurality of circuit components one or more first circuit components to at least one of the one or more first printed circuit traces on each mount as the mount is conveyed along the production line to produce the large quantity of printed circuit boards.

10. The method of claim 9, further including— physically applying from one or more additional rolls of one or more additional pluralities of printed circuit traces one or more additional printed circuit traces to each mount as the mount is conveyed along the production line; and physically applying from one more additional rolls of one or more additional pluralities of circuit components one or more additional circuit components to at least one of the one or more additional printed circuit traces on each mount as the mount is conveyed along the production line, wherein at least one of the additional printed circuit traces includes one or more vias and is layered over at least one of the first printed circuit traces to produce a multi-layered circuit.

11. The method of claim 9, wherein the one or more first printed circuit traces and the one or more additional printed circuit traces are applied to the mount before the one or more first circuit components are applied to the one or more first printed circuit traces and before the one or more additional circuit components are applied to the one or more additional printed circuit traces.

12. The method of claim 9, further including— conveying with an additional mechanical conveyor a plurality of items along the production line, wherein each item has a contoured surface; and applying one or more of the printed circuit boards to the contoured surface on each item.

\* \* \* \* \*